(12) United States Patent
Shih et al.

(10) Patent No.: US 11,538,681 B2
(45) Date of Patent: Dec. 27, 2022

(54) EPITAXY SUBSTRATE AND METHOD OF MANUFACTURING THE SAME

(71) Applicant: GlobalWafers Co., Ltd., Hsinchu (TW)

(72) Inventors: Ying-Ru Shih, Hsinchu (TW);
Chih-Yuan Chuang, Hsinchu (TW);
Chun-I Fan, Hsinchu (TW);
Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 84 days.

(21) Appl. No.: 16/513,657

(22) Filed: Jul. 16, 2019

(65) Prior Publication Data

US 2020/0075328 A1 Mar. 5, 2020

(30) Foreign Application Priority Data

Sep. 3, 2018 (TW) .................................. 107130825

(51) Int. Cl.
*H01L 29/78* (2006.01)
*H01L 29/15* (2006.01)
*H01L 21/02* (2006.01)
*C30B 7/00* (2006.01)
*H01L 21/322* (2006.01)

(52) U.S. Cl.
CPC ........ *H01L 21/02529* (2013.01); *C30B 7/005* (2013.01); *H01L 21/02123* (2013.01); *H01L 21/3226* (2013.01)

(58) Field of Classification Search
CPC .................. H01L 29/1054; H01L 29/1608
See application file for complete search history.

(56) References Cited

U.S. PATENT DOCUMENTS

| 6,831,350 B1* | 12/2004 | Liu .................... H01L 21/02381 257/241 |
| 7,382,023 B2* | 6/2008 | Chen ................. H01L 21/76283 257/E29.295 |
| 2004/0013886 A1* | 1/2004 | Fox ................... H01L 21/76243 257/E21.563 |

(Continued)

FOREIGN PATENT DOCUMENTS

| CN | 102034906 | 4/2011 |
| CN | 106847672 | 6/2017 |

(Continued)

OTHER PUBLICATIONS

Tzu-Hsin Luo, "Effects of Carbon Ion Implantation on NiSi Thermal Stability and Si-C Formation", A Thesis Submitted to Department of Electronics Engineering and Institute of Electronics College of Electrical and Computer Engineering National Chiao Tung University the Degree of Master, Jan. 27, 2011, pp. 1-122.

*Primary Examiner* — Bradley Smith
*Assistant Examiner* — David J Goodwin
(74) *Attorney, Agent, or Firm* — JCIPRNET

(57) ABSTRACT

An epitaxy substrate and a method of manufacturing the same are provided. The epitaxy substrate includes a silicon substrate and a silicon carbide layer. The silicon substrate has a first surface and a second surface opposite to each other, and the first surface is an epitaxy surface. The silicon carbide layer is located in the silicon substrate, and a distance between the silicon carbide layer and the first surface is between 100 angstroms (Å) and 500 angstroms.

7 Claims, 4 Drawing Sheets

(56) References Cited

U.S. PATENT DOCUMENTS

| | | | |
|---|---|---|---|
| 2005/0170664 A1* | 8/2005 | Kurita | C30B 29/52 |
| | | | 438/778 |
| 2009/0085110 A1* | 4/2009 | Giles | H01L 29/78 |
| | | | 257/335 |
| 2009/0140351 A1* | 6/2009 | Lin | H01L 29/66636 |
| | | | 257/407 |
| 2009/0321747 A1 | 12/2009 | Murphy et al. | |
| 2015/0187942 A1* | 7/2015 | Zhu | H01L 29/7371 |
| | | | 257/347 |
| 2016/0365414 A1* | 12/2016 | Peng | H01L 29/7851 |

FOREIGN PATENT DOCUMENTS

| | | |
|---|---|---|
| JP | 2010062219 | 3/2010 |
| TW | 578210 | 3/2004 |
| TW | 201205803 | 2/2012 |
| TW | 201503389 | 1/2015 |

\* cited by examiner

EPITAXY SUBSTRATE AND METHOD OF MANUFACTURING THE SAME

CROSS-REFERENCE TO RELATED APPLICATION

This application claims the priority benefit of Taiwan application serial no. 107130825, filed on Sep. 3, 2018. The entirety of the above-mentioned patent application is hereby incorporated by reference herein and made a part of this specification.

BACKGROUND

Technical Field

The disclosure relates to an epitaxy technique, and more particularly to an epitaxy substrate and a method of manufacturing the same.

Description of Related Art

Epitaxy refers to a technique of growing new crystals on a wafer to form a semiconductor layer. Since a film layer formed by an epitaxial process has advantages such as high purity, good thickness control and the like, epitaxy has been widely used in the manufacture of radio frequency devices or power devices.

Nevertheless, at an epitaxy-substrate interface, there is often a problem of interface loss of the epitaxy-substrate interface, resulting from spontaneous polarization induced by an epitaxial material itself, piezoelectric polarization induced by lattice mismatch between the epitaxy and the substrate, or diffusion of epitaxial layer atoms to the substrate.

In addition, if the required epitaxy substrate is a silicon-on-insulator (SOI) substrate, a highly conductive charge inversion layer or accumulation layer is likely to form at an interface between a buried oxide (BOX) layer and the substrate, which may decrease the resistivity of the substrate and cause parasitic power loss. Therefore, a solution is needed urgently to solve the foregoing problems.

SUMMARY

The disclosure provides an epitaxy substrate capable of solving the problem of interface loss of the epitaxy-substrate interface and the problem of parasitic power loss.

The disclosure further provides a method of manufacturing the epitaxy substrate for manufacturing a substrate capable of solving the problem of interface loss of the epitaxy-substrate interface and the problem of parasitic power loss.

An epitaxy substrate provided by an embodiment of the disclosure includes a silicon substrate and a silicon carbide layer. The silicon substrate has a first surface and a second surface opposite to each other, and the first surface is an epitaxy surface. The silicon carbide layer is located in the silicon substrate, and a distance between the silicon carbide layer and the first surface is between 100 angstroms (Å) and 500 angstroms.

In an embodiment of the disclosure, the first surface of the silicon substrate has a single crystalline structure.

In an embodiment of the disclosure, a thickness of the silicon carbide layer is between 100 angstroms and 4,000 angstroms.

In an embodiment of the disclosure, a surface roughness of the first surface of the silicon substrate is between 0.1 nm and 0.3 nm.

In an embodiment of the disclosure, the silicon carbide layer is a single-layered structure or a multi-layered structure.

In an embodiment of the disclosure, the multi-layered structure includes a first layer and a second layer, and the first layer is located between the second layer and the first surface.

In an embodiment of the disclosure, the first layer is in contact with the second layer directly.

In an embodiment of the disclosure, the first layer is not in contact with the second layer directly.

In an embodiment of the disclosure, a distance between the first layer and the second layer is between 100 angstroms and 500 angstroms.

In an embodiment of the disclosure, a concentration of carbon ions of the first layer is greater than a concentration of carbon ions of the second layer.

In an embodiment of the disclosure, the silicon substrate includes a silicon-on-insulator (SOI) substrate.

A method of manufacturing the epitaxy substrate in an embodiment of the disclosure includes the following steps. A silicon substrate having a first surface and a second surface opposite to each other is provided. An ion implantation process is performed on the first surface of the silicon substrate to implant carbon ions into the silicon substrate. A high-temperature annealing treatment is performed to diffuse the carbon ions and form a silicon carbide layer in the silicon substrate. A distance between the silicon carbide layer and the first surface is between 100 angstroms and 500 angstroms.

In another embodiment of the disclosure, implantation energy of the ion implantation process is between 5 KeV and 15 KeV.

In another embodiment of the disclosure, an implantation dosage in the ion implantation process is between $1\times10^{12}$ $cm^{-2}$ and $5\times10^{15}$ $cm^{-2}$.

In another embodiment of the disclosure, an implantation concentration in the ion implantation process is between $2\times10^{17}$ $cm^{-3}$ and $2.7\times10^{21}$ $cm^{-3}$.

In another embodiment of the disclosure, a temperature of the high-temperature annealing treatment is between 1,200 (° C.) degrees and 1,300° C.

In another embodiment of the disclosure, time for the high-temperature annealing treatment is between 5 hours and 10 hours.

In another embodiment of the disclosure, an atmosphere of the high-temperature annealing treatment is argon gas, nitrogen gas, or a combination thereof.

To sum up, in the embodiments of the disclosure, the silicon carbide layer is located inside the silicon substrate, and a distance between the silicon carbide layer and the first surface is controlled to be between 100 angstroms (Å) and 500 angstroms. Therefore, through the presence of the silicon carbide layer, the problem of interface loss at an epitaxy surface due to spontaneous or piezoelectric polarization and the problem of parasitic power loss are solved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
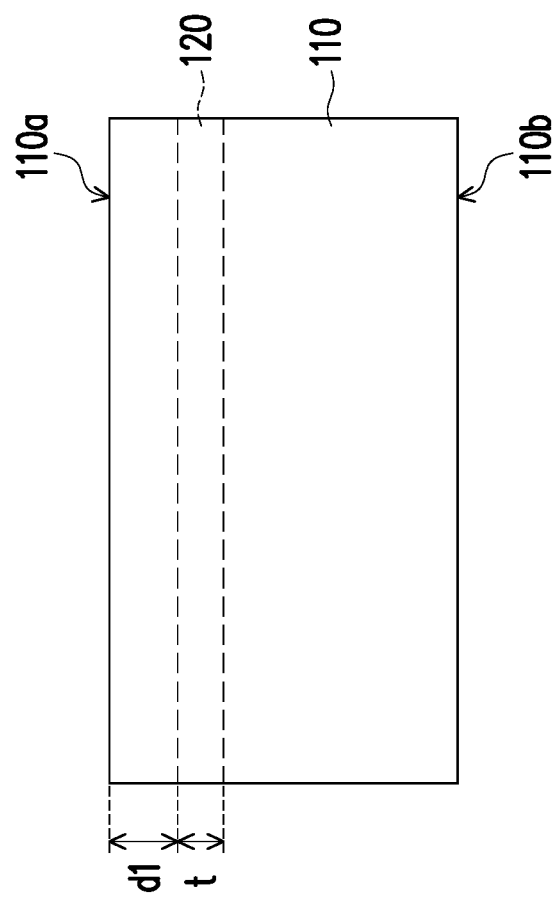
FIG. 1 is a schematic cross-sectional view of an epitaxy substrate according to a first embodiment of the disclosure.

Exemplary embodiments of the disclosure will be described comprehensively below with reference to the drawings, but the disclosure may be embodied in many different forms and should not be construed as being limited to the embodiments described herein. For clarity, in the drawings, sizes and thicknesses of regions, portions and layers are not illustrated in accordance with actual proportions. To facilitate understanding, the same components will hereinafter be denoted by the same reference numerals.

Figure 2:
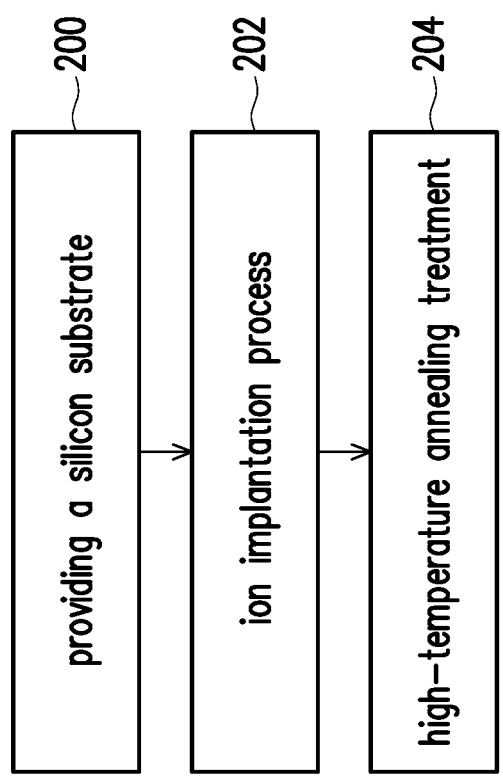
FIG. 2 is a chart of steps of manufacturing the epitaxy substrate of the first embodiment.

FIG. 1 is a schematic cross-sectional view of an epitaxy substrate according to a first embodiment of the disclosure. FIG. 2 is a chart of steps of manufacturing the epitaxy substrate of FIG. 1.

With reference to FIG. 1 and FIG. 2, in step 200, a silicon substrate 110 is provided. The silicon substrate 110 of this embodiment has a first surface 110a and a second surface 110b opposite to each other. A material of the silicon substrate 110 is, for example, silicon, silicon carbide, or other silicon-containing materials; nevertheless, the disclosure is not limited thereto. In other embodiments, the silicon substrate 110 may also be a silicon substrate implanted with, for example, carbon, oxygen, or nitrogen. The silicon substrate 110 may preferably have a crystal orientation of (111) according to subsequent epitaxial requirements. However, the disclosure is not limited thereto. In another embodiment, the silicon substrate 110 may be a silicon-on-insulator (SOI) substrate. In this embodiment, the first surface 110a of the silicon substrate 110 has a single crystalline structure and acts as an epitaxy surface. In terms of providing favorable epitaxy quality, a surface roughness of the first surface 110a of the silicon substrate 110 is, for example, between 0.1 nm and 0.3 nm.

Then, in step 202, an ion implantation process is performed on the first surface 110a of the silicon substrate 110 to implant carbon ions into the silicon substrate 110. Since the carbon ions are the same group elements as the silicon atoms in the silicon substrate 110, a character of high resistivity of the silicon substrate 110 implanted with the carbon ions is maintained. In this embodiment, implantation energy of the ion implantation process is, for example, less than 15 KeV. In terms of not affecting the quality of the first surface 110a, the implantation energy of the ion implantation process is, for example, between 5 KeV and 15 KeV. In this embodiment, an implantation dosage in the ion implantation process is, for example, $1\times10^{12}$ cm$^{-2}$ and $5\times10^{15}$ cm$^{-2}$, and an implantation concentration in the ion implantation process is, for example, between $2\times10^{17}$ cm$^{-3}$ and $2.7\times10^{21}$ cm$^{-3}$. Since energy of the carbon ions implanted into the silicon substrate 110 is not great, the structure of the first surface 110a of the silicon substrate 110 is not affected, so that epitaxy quality of the first surface 110a is not to be affected.

Next, in step 204, a high-temperature annealing treatment is performed to diffuse the carbon ions and form a silicon carbide layer 120 in the silicon substrate 110, and the epitaxy substrate 10 is thus substantially completed. In this embodiment, a temperature of the high-temperature annealing treatment is, for example, between 1,200 degrees (° C.) and 1,300° C. Time for the high-temperature annealing treatment is between 5 hours and 10 hours. An atmosphere of the high-temperature annealing treatment is, for example, argon gas, nitrogen gas, or a combination of the foregoing, but the disclosure is not limited thereto.

In step 204, parameters of the high-temperature annealing treatment may be adjusted according to needs. Further, a distance d1 between the silicon carbide layer 120 and the first surface 110a may be controlled to be greater than 100 angstroms (Å) through applying different parameters, where the distance is preferably between 100 angstroms and 500 angstroms, and more preferably between 183 angstroms and 499 angstroms. For instance, in the ion implantation process, the implantation energy is, for example, 5 KeV, the implantation dosage is, for example, $1\times10^{12}$ cm$^{-2}$, and the implantation concentration is, for example, $2\times10^{17}$ cm$^{-3}$, and that the distance d1 obtained is approximately 183 angstroms. In addition, in the ion implantation process, the implantation energy is, for example, 15 KeV, the implantation dosage is, for example, $5\times10^{15}$ cm$^{-2}$, and the implantation concentration is, for example, $2.7\times10^{21}$ cm$^{-3}$, and that the distance d1 obtained is approximately 499 angstroms. In this embodiment, a thickness t of the silicon carbide layer 120 is, for example, between 100 angstroms and 4,000 angstroms.

Based on the above, through the presence of the silicon carbide layer 120 close to the epitaxy surface, insulation and heat dissipation capabilities of the epitaxy substrate 10 applied to radio frequency devices or power devices may be improved, so that device performance may be further enhanced. In addition, due to the presence of the silicon carbide layer 120, defects can be formed to capture electrons, and thereby, the problem of interface loss at an epitaxy surface due to spontaneous or piezoelectric polarization and the problem of device frequency loss caused by parasitic channels are solved.

Figure 3:
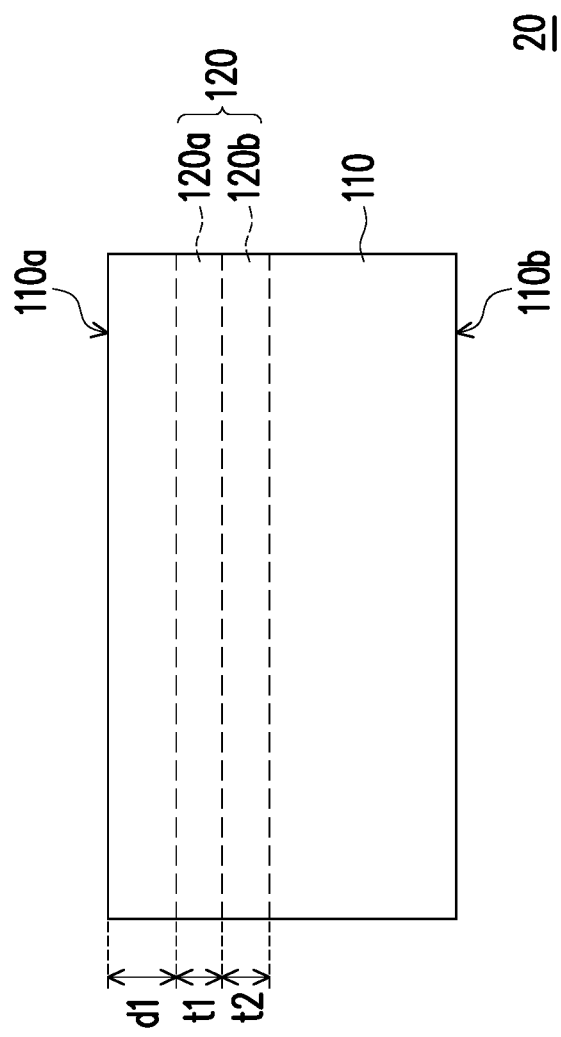
FIG. 3 is a schematic cross-sectional view of an epitaxy substrate according to a second embodiment of the disclosure.

FIG. 3 is a schematic cross-sectional view of an epitaxy substrate according to a second embodiment of the disclosure. It should be noted that the reference numerals and a part of the contents in the embodiment of FIG. 1 are also used to describe the second embodiment, in which the same reference numerals are used to represent identical or similar devices, and thus descriptions of the same technical contents are omitted. Please refer to the descriptions of the previous embodiment for the omitted contents, which will not be repeated hereinafter.

A difference between the embodiment of FIG. 3 and the embodiment of FIG. 1 is that: the silicon carbide layer 120 is a multi-layered structure.

With reference to FIG. 3, in an epitaxy substrate 20 in the present embodiment, the silicon carbide layer 120 is a multi-layered structure, and the multi-layered structure includes a first layer 120a and a second layer 120b. The first layer 120a is located between the second layer 120b and the first surface 110a. In this embodiment, the first layer 120a is in contact with the second layer 120b directly. In this embodiment, a thickness t1 of the first layer 120a and a thickness t2 of the second layer 120b are between 100 angstroms and 4,000 angstroms. The thickness t1 of the first layer 120a and the thickness t2 of the second layer 120b may be identical or may be different. Carbon ion concentrations of the first layer 120a and the second layer 120b may be identical or may be different. For instance, if the carbon ion concentration of the first layer 120a is greater than the carbon ion concentration of the second layer 120b, device insulation and heat dissipation capabilities are enhanced.

In FIG. 3, the multi-layered structure of the silicon carbide layer 120 is depicted to include two silicon carbide layers only; nevertheless, the disclosure is not limited thereto. In other embodiments, the multi-layered structure of the silicon carbide layer 120 may include three or more silicon carbide layers. As the epitaxy substrate 20 includes the silicon carbide layer 120, insulation and heat dissipation capabilities of radio frequency devices or power devices may be improved, and device performance may be enhanced. In addition, due to the presence of the silicon carbide layer 120, defects can be formed to capture electrons, and thereby, the problem of interface loss at an epitaxy surface due to spontaneous or piezoelectric polarization and the problem of device frequency loss caused by parasitic channels are solved.

In this embodiment, a method of manufacturing the epitaxy substrate 20 is substantially identical to the method of manufacturing the epitaxy substrate 10. The silicon carbide layer 120 having the multi-layered structure is formed through applying different implantation energy, implantation dosage, and implantation concentration in the ion implantation process.

Figure 4:
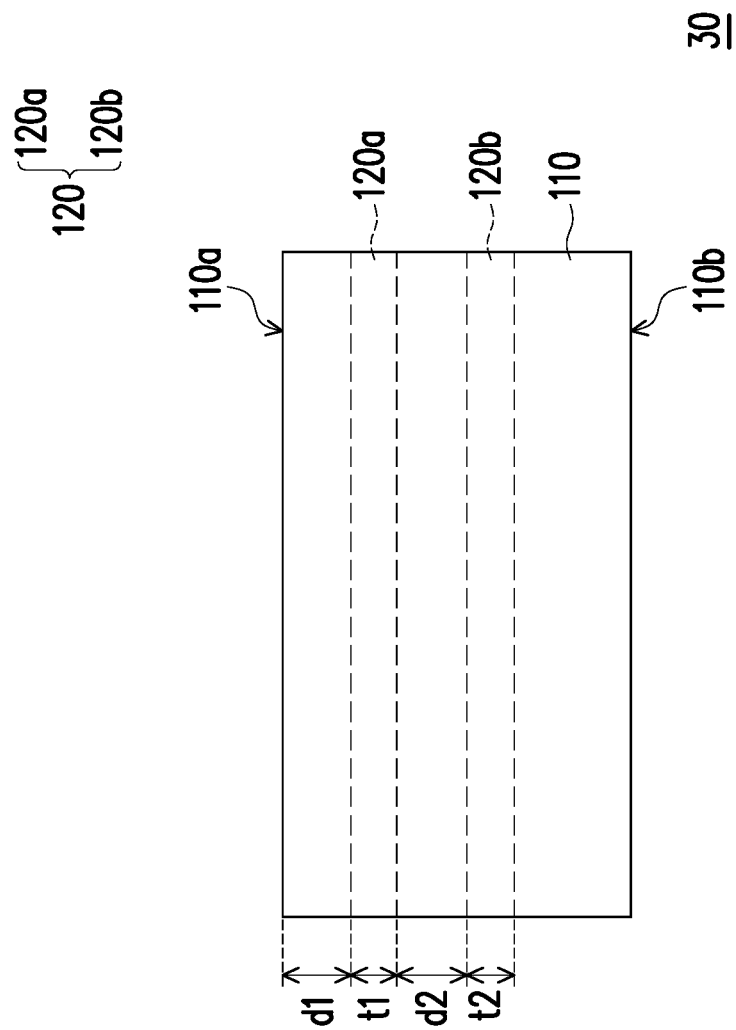
FIG. 4 is a schematic cross-sectional view of an epitaxy substrate according to a third embodiment of the disclosure.

FIG. 4 is a schematic cross-sectional view of an epitaxy substrate according to a third embodiment of the disclosure. It should be noted that the reference numerals and a part of the contents in the second embodiment of FIG. 3 are also used to describe the embodiment of FIG. 4, in which the same reference numerals are used to represent identical or similar devices, and thus descriptions of the same technical contents are omitted. Please refer to the descriptions of the previous embodiment for the omitted contents, which will not be repeated hereinafter.

A difference between the embodiment of FIG. 4 and the embodiment of FIG. 3 is that: the first layer 120a is not in contact with the second layer 120b directly.

With reference to FIG. 4, in an epitaxy substrate 30 of this embodiment, the first layer 120a is not in contact with the second layer 120b directly. Further, a distance d2 is provided between the first layer 120a and the second layer 120b, and the distance d2 is between, for example, 100 angstroms and 500 angstroms. Further, positions of the first layer 120a and the second layer 120b may be changed through controlling energy levels of the implantation energy of the ion implantation process forming the first layer 120a and the implantation energy of the ion implantation process forming the second layer 120. Further, the distance d2 between the first layer 120a and the second layer 120b may be accordingly adjusted.

In FIG. 4, the multi-layered structure of the silicon carbide layer 120 is depicted to include two silicon carbide layers only; nevertheless, the disclosure is not limited thereto. The carbon ion concentrations of the first layer 120a and the second layer 120b may be identical or may be different. For instance, if the carbon ion concentration of the first layer 120a is greater than the carbon ion concentration of the second layer 120b, device insulation and heat dissipation capabilities are enhanced. In other embodiments, the multi-layered structure of the silicon carbide layer 120 may include three or more silicon carbide layers. As the epitaxy substrate 30 includes the silicon carbide layer 120, insulation and heat dissipation capabilities of radio frequency devices or power devices may be improved, and device performance may be enhanced. In addition, due to the presence of the silicon carbide layer 120, defects can be formed to capture electrons, and thereby, the problem of interface loss at an epitaxy surface due to spontaneous or piezoelectric polarization and the problem of device frequency loss caused by parasitic channels are solved.

In this embodiment, a method of manufacturing the epitaxy substrate 30 is substantially identical to the method of manufacturing the epitaxy substrate 10. In this embodiment, the silicon carbide layer 120 having the multi-layered structure is formed through applying different implantation energy, implantation dosage, and implantation concentration in the ion implantation process.

In view of the foregoing, in the embodiments of the disclosure, the single-layered or multi-layered silicon carbide layer is formed in the silicon substrate. Further, the distance between the silicon carbide layer and the first surface of the silicon substrate is between 100 angstroms (Å) and 500 angstroms. In this way, insulation and heat dissipation capabilities of radio frequency devices or power devices are improved, the quality of the epitaxy surface of the silicon substrate is not affected, and device performance is thereby enhanced. Moreover, in the disclosure, the carbon ions are implanted into the silicon substrate, and since the carbon ions and the silicon atoms are the same group elements, the character of high resistivity of the silicon substrate is maintained. In addition, due to the presence of the silicon carbide layer, defects can be formed to capture electrons, and thereby, both the problem of interface loss at an epitaxy surface (i.e., the first surface of the silicon substrate) due to spontaneous or piezoelectric polarization and the problem of device frequency loss caused by parasitic channels are solved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An epitaxy substrate, comprising:
a silicon substrate, having a first surface and a second surface opposite to each other, wherein the first surface is an epitaxy surface, wherein a surface roughness of the first surface of the silicon substrate is between 0.1 nm and 0.3 nm; and
a silicon carbide layer, formed in the silicon substrate to entirely divide the silicon substrate into two parts along a plane parallel to the first surface, wherein a distance between the silicon carbide layer and the first surface is between 100 angstroms and 500 angstroms, the silicon carbide layer is a multi-layered structure, the multi-layered structure at least comprises a first layer and a second layer, and the first layer is located between the second layer and the first surface, wherein the first layer is not in contact with the second layer directly.

2. The epitaxy substrate as claimed in claim 1, wherein the first surface of the silicon substrate has a single crystalline structure.

3. The epitaxy substrate as claimed in claim 1, wherein a thickness of the silicon carbide layer is between 100 angstroms and 4,000 angstroms.

4. The epitaxy substrate as claimed in claim 1, wherein a distance between the first layer and the second layer is between 100 angstroms and 500 angstroms.

5. The epitaxy substrate as claimed in claim 1, wherein a concentration of carbon ions of the first layer is greater than a concentration of carbon ions of the second layer.

6. The epitaxy substrate as claimed in claim 1, wherein the silicon substrate comprises a silicon-on-insulator (SOI) substrate.

7. An epitaxy substrate, comprising:
- a silicon substrate, having a first surface and a second surface opposite to each other, wherein the first surface is an epitaxy surface; and
- a silicon carbide layer, located in the silicon substrate, the silicon carbide layer is a multi-layered structure, the multi-layered structure comprises a first layer and a second layer, the first layer is not in contact with the second layer directly, and the first layer is located between the second layer and the first surface, wherein a distance between the first layer and the second layer is between 100 angstroms and 500 angstroms, and a distance between the first layer and the first surface is between 100 angstroms and 500 angstroms.

* * * * *